(12) United States Patent
Shim (10) Patent No.: US 7,598,135 B2
(45) Date of Patent: Oct. 6, 2009

(54) METHOD FOR FABRICATING CMOS IMAGE SENSOR

(75) Inventor: Hee Sung Shim, Gangneung-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 507 days.

(21) Appl. No.: 11/612,609

(22) Filed: Dec. 19, 2006

(65) Prior Publication Data

US 2007/0155082 A1 Jul. 5, 2007

(30) Foreign Application Priority Data

Dec. 29, 2005 (KR) .................. 10-2005-0134452

(51) Int. Cl.
*H01L 21/8238* (2006.01)
(52) U.S. Cl. ............. 438/200; 438/532; 257/E21.352
(58) Field of Classification Search .......... 438/59, 438/200, 532, 545; 257/E21.352
See application file for complete search history.

(56) References Cited

U.S. PATENT DOCUMENTS 6,303,421 B1 * 10/2001 Chang ................. 438/228
7,126,102 B2 * 10/2006 Inoue et al. ............ 250/214 R
2005/0093036 A1 * 5/2005 Han ..................... 257/291

* cited by examiner

*Primary Examiner*—Chandra Chaudhari
(74) *Attorney, Agent, or Firm*—Saliwanchik, Lloyd & Saliwanchik

(57) ABSTRACT

Provided is a method for fabricating CMOS image sensor. One method includes: preparing a semiconductor substrate in which a photodiode region and a transistor region are defined; sequentially forming an insulating layer and a conductive layer on an entire surface of the semiconductor substrate; forming a photoresist pattern for a gate electrode on the conductive layer; etching the conductive layer to a predetermined thickness using the photoresist pattern as a mask; performing an ion implantation process on the etched conductive layer to form a doped conductive layer; performing an oxidation process on the resultant structure including the doped conductive layer for oxidizing the doped conductive layer so as to form an oxide layer; and removing the oxide layer and the insulating layer disposed thereunder to define a gate electrode and a gate insulating layer.

7 Claims, 7 Drawing Sheets

METHOD FOR FABRICATING CMOS IMAGE SENSOR

RELATED APPLICATION(S)

This application claims the benefit under 35 U.S.C. §119(e) of Korean Patent Application Number 10-2005-0134452 filed Dec. 29, 2005, which is incorporated herein by reference in its entirety.

FIELD OF THE INVENTION

The present invention relates to a method for fabricating an image sensor, and more particularly, to a method for fabricating a complementary metal oxide semiconductor (CMOS) image sensor capable of improved low light performance.

BACKGROUND OF THE INVENTION

Generally, an image sensor, which converts an optical image into an electrical signal, is classified as a charge coupled device (CCD) or a complementary metal oxide semiconductor (CMOS) image sensor.

The CCD includes a plurality of photo diodes PD for converting a light signal into an electrical signal arranged in a matrix form; a plurality of vertical charge coupled devices (VCCD) formed between the photodiodes and arranged in a vertical direction for vertically transferring charges generated at the respective photodiodes; a plurality of horizontal charge coupled devices (HCCD) for horizontally transferring the charges transferred from their respective VCCDs; and a sense amplifier for outputting the electrical signal by sensing the horizontally transferred charges.

The CCD, however, has several disadvantages such as complicated driving system, high power consumption, and a complicated fabrication process due to the plurality of photolithographic processes.

In addition, the CCD is also disadvantageous in miniaturizing the product because it is very difficult to integrate a control circuit, a signal processing circuit, an analog to digital (A/D) converter, etc, within a CCD chip.

To overcome the above disadvantages of the CCD, the CMOS image sensor has been highlighted as the next-generation image sensor.

The CMOS image sensor employs a switching mode that sequentially detects outputs of unit pixels using MOS transistors formed using CMOS technology. The switching mode is accomplished by forming MOS transistors corresponding to the number of the unit pixels on a semiconductor substrate and using a control circuit and a signal processing circuit as peripheral circuits.

That is, the CMOS image sensor displays an image by sequentially detecting electrical signals of the respective unit pixels through the switching mode, wherein each unit pixel is configured with a photodiode and MOS transistors.

Since the CMOS image sensor is fabricated using the CMOS technology, the CMOS image sensor has advantageous merits such as low power consumption, and a simple fabrication process in virtue of the relatively small number of photolithographic processes.

Further, because the CMOS image sensor enables a control circuit, a signal processing circuit, and an A/D converter to be integrated in the CMOS image sensor chip, it is advantageous in that a small sized product can be fabricated with ease.

Therefore, the CMOS image sensor is widely used for various applications such as a digital still camera and a digital video camera.

The CMOS image sensor is classified as a 3T type, a 4T type, or a 5T type, etc., according to the number of the transistors in each unit pixel. For example, the 3T type CMOS image sensor is configured with one photodiode and three transistors, and the 4T type CMOS image sensor is configured with one photodiode and four transistors.

A layout for a unit cell of the 4T type CMOS image sensor is described below with reference to FIGS. 1 and 2.

Figure 1:
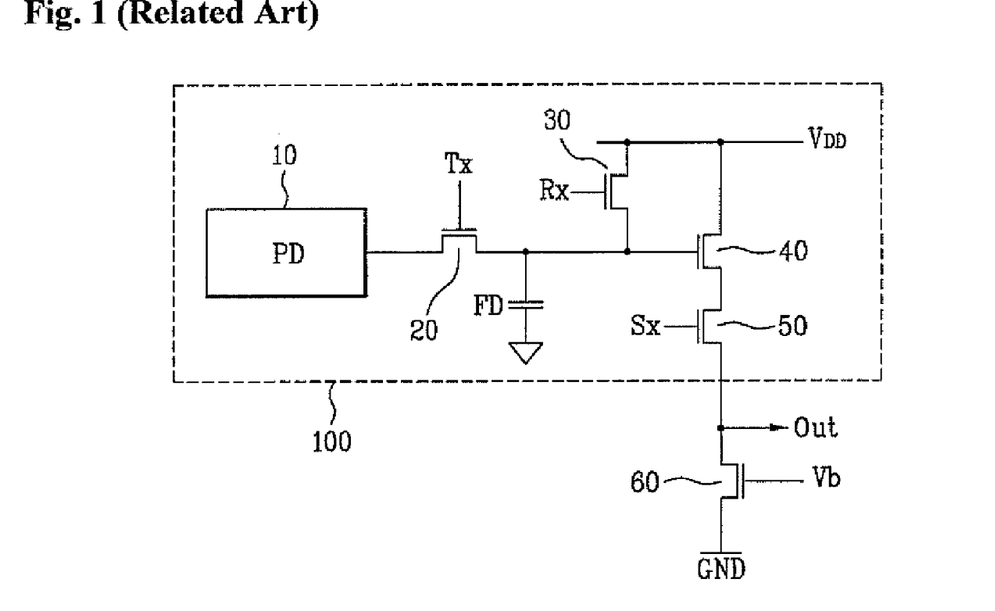
FIG. 1 is an equivalent circuit diagram of a related art 4T type CMOS image sensor.
Figure 2:
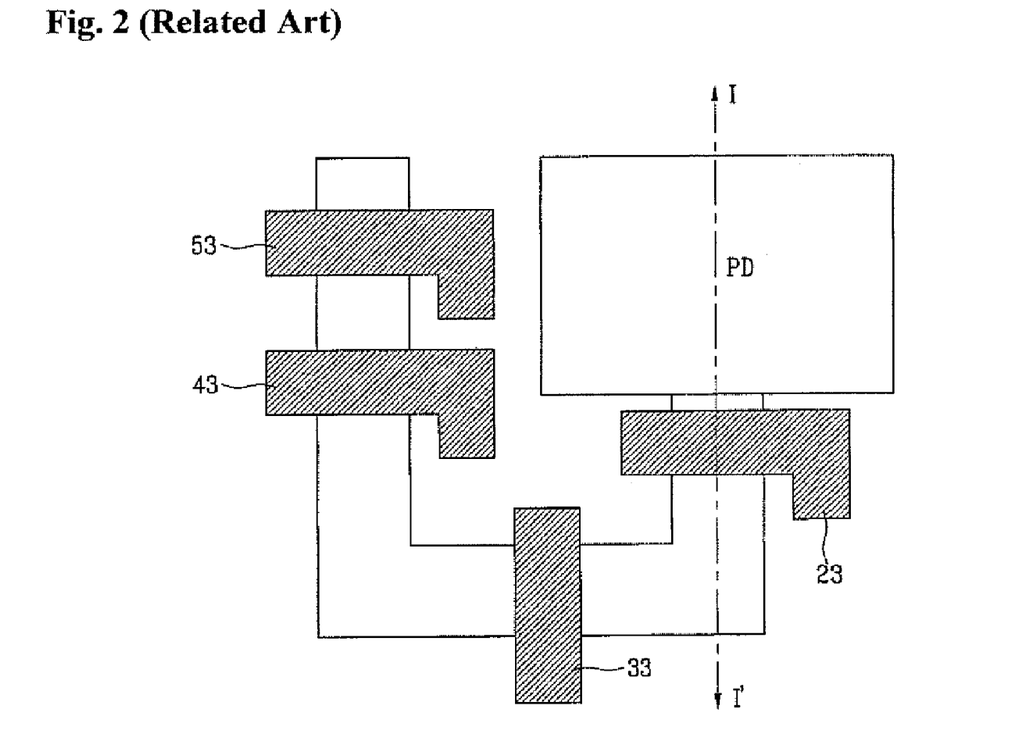
FIG. 2 is a layout illustrating a unit cell of the 4T type CMOS image sensor.

FIG. 1 is an equivalent circuit diagram of a related art 4T type CMOS image sensor, and FIG. 2 is a layout illustrating a unit cell of the 4T type CMOS image sensor.

Referring to FIG. 1, the unit pixel 100 of the CMOS image sensor includes a photodiode 10 acting as a photoelectric converter, and four transistors.

Herein, the four transistors are configured as a transfer transistor 20, a reset transistor 30, a drive transistor 40, and a select transistor 50. A load transistor 60 is electrically connected to an output terminal OUT of each of the unit pixels 100.

Reference symbols FD, Tx, Rx, and Sx denote a floating diffusion region, the gate voltage of the transfer transistor 20, the gate voltage of the reset transistor 30, and the gate voltage of the select transistor 50, respectively.

In the unit pixel of the related art 4T type CMOS image sensor illustrated in FIG. 2, an active region is defined by a solid line and a device isolation region is defined as the region not being the active region. The photodiode PD is formed at the wide portion of the active region, and gate electrodes 23, 33, 43 and 53 of the four transistors are formed overlapping the narrow portion of the active region.

That is, the transfer transistor 20, the reset transistor 30, the drive transistor 40 and the select transistor 50 are formed by the gate electrodes 23, 33, 43 and 53, respectively.

Herein, impurity ions are implanted onto the active area by each transistor 20, 30, 40 and 50 except directly below each gate electrode 23, 33, 43 and 53 to form source/drain regions (S/D) of each transistor.

FIGS. 3A to 3E are sectional views taken along line I-I' illustrating a method for fabricating the related art CMOS image sensor.

Figure 3A:
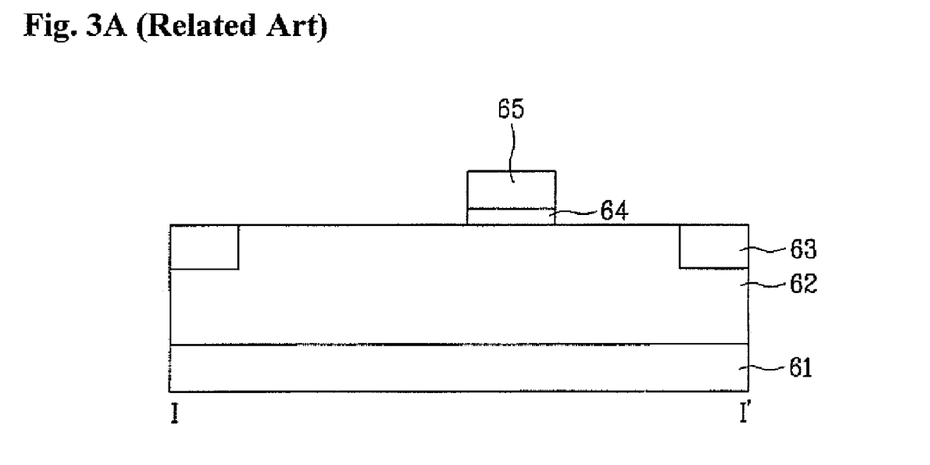
FIGS. 3A to 3C are sectional views illustrating a method for fabricating the related art CMOS image sensor.

Referring to FIG. 3A, an epitaxial process is performed to form a lightly doped p-type epitaxial layer 62 on a heavily doped p-type semiconductor substrate 61.

Subsequently, an active region and a device isolation region are defined in the semiconductor substrate 61, and a device isolation layer 63 is then formed on the device isolation region using a shallow trench isolation (STI) process.

An insulating layer and a conductive layer, e.g., a heavily doped polysilicon layer, are sequentially deposited on the entire surface of the epitaxial layer 62. Thereafter, the conductive layer and the insulating layer are selectively removed to form a gate electrode 65 and a gate insulating layer 64.

Figure 3B:
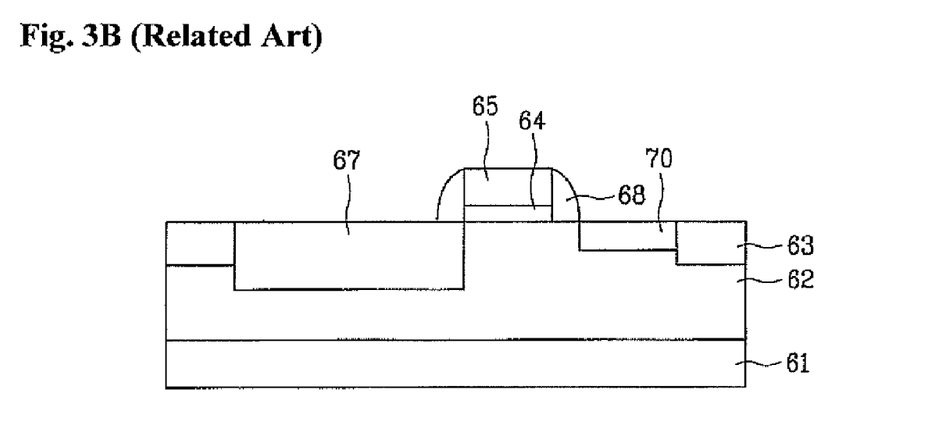

Referring to FIG. 3B, a first photoresist layer is coated on the entire surface of the semiconductor substrate 61, and is then patterned so as to expose blue, green, and red photodiode regions through exposure and development processes.

Afterwards, lightly doped n-type impurity ions are implanted onto the epitaxial layer 62 using the patterned first photoresist layer as a mask to form a lightly doped n-type diffusion region 67 for the blue, green, red photodiode regions.

Next, after the first photoresist layer is completely removed, an insulating layer is deposited on the entire surface of the semiconductor substrate 61 and an etch-back process is then performed to form spacers 68 on side surfaces of the gate electrode 65.

Thereafter, a second photoresist layer is coated on the entire surface of the semiconductor substrate 61, and is then patterned so as to cover the photodiode region but expose the source/drain regions of each transistor through exposure and development processes.

Subsequently, n-type impurity ions are implanted at high concentration onto the exposed source/drain regions using the patterned second photoresist layer as a mask to form an n-type diffusion region (floating diffusion region) 70.

Figure 3C:
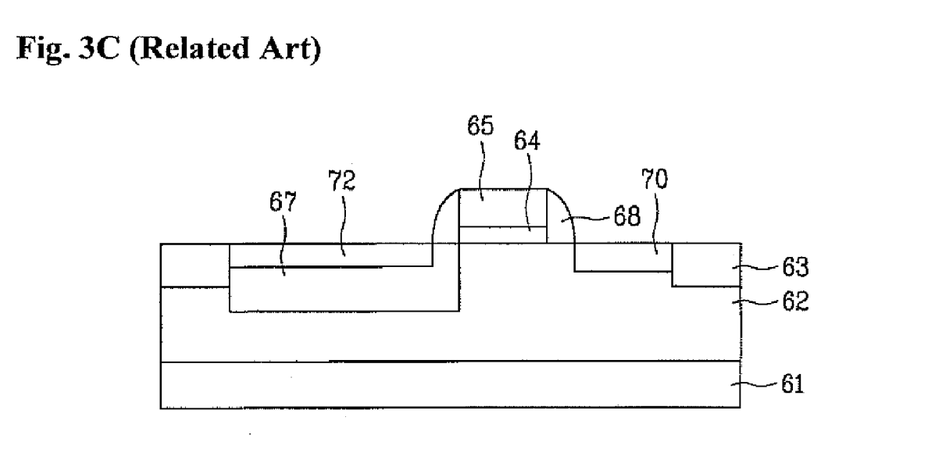

Referring to FIG. 3C, the patterned second photoresist layer is removed. A third photoresist layer is coated on the entire surface of the semiconductor substrate 61, and thereafter it is patterned so as to expose the respective photodiode regions through exposure and development processes. Then, p-type impurity ions are implanted onto the photodiode region having the n-type diffusion region 67 using the patterned third photoresist layer as a mask so that a p-type diffusion region 72 is formed beneath the surface of the semiconductor substrate 61. Next, after the patterned third photoresist layer 71 is removed, a thermal treatment is performed on the semiconductor substrate 61 to diffuse the respective impurity diffusion regions.

However, the related art method for fabricating the CMOS image sensor has several problems as discussed below.

The etching process, which is performed for selectively removing the gate insulating layer and the conductive layer so as to form the gate electrode, causes damage to the semiconductor substrate at the region where the photodiode PD is formed.

Moreover, when the ion implantation process, e.g., the ion implantation for forming the source/drain regions, is formed on the damaged semiconductor substrate, the semiconductor substrate becomes more damaged due to the ion implantation process, which results in increasing a dark current of the unit pixel with respect to the photodiode formed in the damaged semiconductor substrate. Accordingly, the low light performance of the CMOS image sensor becomes degraded.

BRIEF SUMMARY

Accordingly, embodiments of the present invention are directed to a method for fabricating a complementary metal oxide semiconductor (CMOS) image sensor that substantially obviates one or more problems due to limitations and disadvantages of the related art.

An object of the present invention is to provide a method for fabricating a CMOS image sensor capable of improving low light performance.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for fabricating a complementary metal oxide semiconductor image sensor, including: preparing a semiconductor substrate in which a photodiode region and a transistor region are defined; sequentially forming an insulating layer and a conductive layer on an entire surface of the semiconductor substrate; forming a photoresist pattern on the conductive layer; etching the conductive layer to a predetermined thickness using the photoresist pattern as a mask; performing ion implantation process on the etched conductive layer to form a doped conductive layer; performing an oxidation process on the resultant structure including the doped conductive layer for oxidizing the doped conductive layer so as to form an oxide layer; and removing the oxide layer and the insulating layer disposed thereunder to define a gate electrode and a gate insulating layer.

In addition, the method can further include: forming a first diffusion region in the photodiode region after forming the gate electrode and the gate insulating layer; forming spacers on sidewalls of the gate electrode and the gate insulating layer; forming a second diffusion region in the transistor region after forming the spacers; and forming a third diffusion region in the first diffusion region.

Furthermore, the ion implantation process for forming the doped conductive layer can be performed using arsenide (As) ions, phosphorous (P) ions or boron (B) ions.

In another aspect of the present invention, there is provided a method for fabricating a complementary metal oxide semiconductor image sensor, including: preparing a semiconductor substrate where a photodiode region and a transistor region are formed; sequentially forming an insulating layer and a conductive layer on an entire surface of the semiconductor substrate; forming a first photoresist pattern on the conductive layer; etching the conductive layer to a predetermined thickness using the first photoresist pattern as a mask; forming a second photoresist pattern on the etched conductive layer so as to cover the photodiode region; etching the conductive layer and the insulating layer using the second photoresist pattern as a mask to leave the portion of conductive layer and the insulating layer remaining over the photodiode region; removing the first and second photoresist patterns; forming a third photoresist pattern exposing only the photodiode region; and removing the conductive layer and the oxide layer formed over the photodiode region using the third photoresist pattern as a mask to define a gate electrode and a gate oxide layer in the transistor region.

In addition, the method can further include: forming a first diffusion region in the photodiode region after forming the gate electrode and the gate insulating layer; forming spacers on sidewalls of the gate electrode and the gate insulating layer; forming a second diffusion region in the transistor region after forming the spacers; and forming a third diffusion region in the first diffusion region.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 4A to 4E are sectional views taken along the line I-I' of FIG. 2, illustrating a method for fabricating a complementary metal oxide semiconductor (CMOS) image sensor according to a first embodiment of the present invention.

Figure 4A:
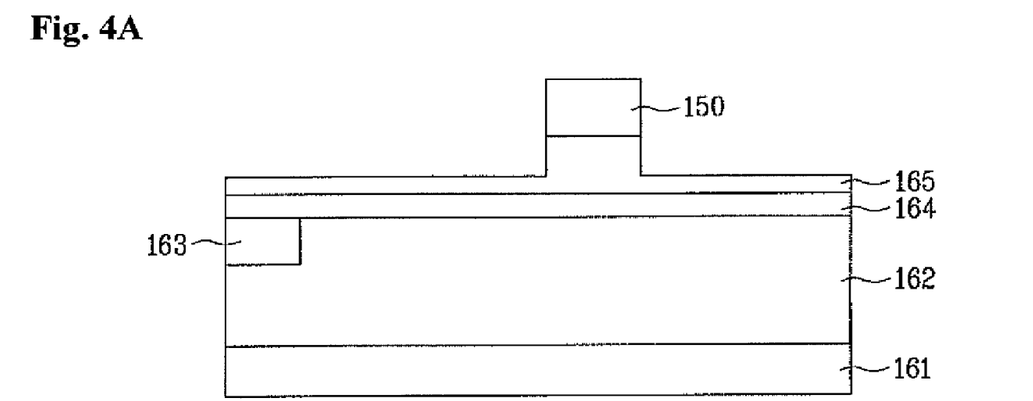
FIGS. 4A to 4E are sectional views illustrating a method for fabricating a CMOS image sensor according to a first embodiment of the present invention.

Referring to FIG. 4A, an epitaxial process can be performed to form a lightly doped p-type epitaxial layer 162 on a heavily doped p-type semiconductor substrate 161.

Subsequently, an active region and a device isolation region can be defined in the semiconductor substrate 161, and a device isolation layer 163 can then be formed on the device isolation region using shallow trench isolation (STI) process.

Herein, although not shown in the figures, a method for forming the device isolation layer 163 is described below.

First, a pad oxide layer, a pad nitride layer, and a tetra ethyl ortho silicate (TEOS) oxide layer can be sequentially formed on the semiconductor substrate. Then, a photoresist layer can be coated on the TEOS layer and patterned by exposure and development processes to define the active region and the device isolation region. In particular, the photoresist pattern can expose the TEOS layer over the device isolation region.

Subsequently, the pad oxide layer, the pad nitride layer, and the TEOS oxide layer over the device isolation region can be selectively removed using the photoresist pattern as a mask.

Then, the semiconductor substrate 161 of the device isolation region can be etched to a predetermined depth using the patterned pad oxide layer, the patterned pad nitride layer, and the patterned TEOS oxide layer as a mask, thereby forming a trench. Then, the photoresist pattern can be removed.

Thereafter, the trench can be filled with an insulating material to form the device isolation layer 163 in the trench. After that, the patterned pad oxide layer, the patterned pad nitride layer, and the patterned TEOS oxide layer can be removed.

Referring back to FIG. 4A, an insulating layer 164 for a gate insulating layer and a conductive layer 165 can be sequentially deposited on the entire surface of the epitaxial layer 162 including device isolation layer 163. In an embodiment, the conductive layer 165 can be a silicon layer.

In one embodiment, the insulating layer 164 may be formed using a thermal oxidation process or a chemical vapor deposition (CVD) process.

Subsequently, a photoresist layer can be coated on the conductive layer 165. After aligning a photo mask having a predetermined pattern over the photoresist layer, a light beam can be irradiated onto the photoresist layer using the photo mask. Thus, the photoresist layer can be exposed and then developed to form a photoresist pattern 150 which will be used for defining a gate electrode.

Afterward, the conductive layer 165 can be etched to a predetermined thickness using the photoresist pattern 150 as a mask.

Accordingly, the conductive layer remains intact under the photoresist pattern 150 and the conductive layer not covered with the photoresist pattern 150 remains on the entire surface of the substrate recessed to the predetermined thickness so that it is possible to prevent the semiconductor substrate from being damaged in an etching process.

Figure 4B:
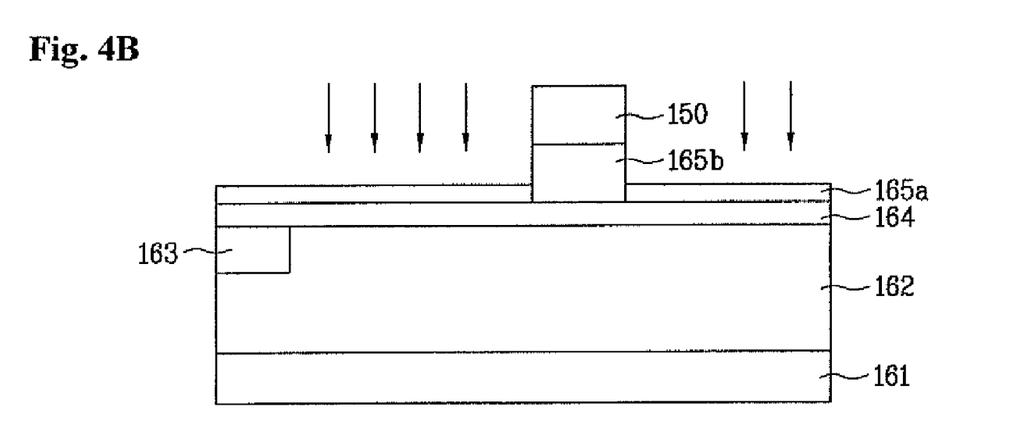

Referring to FIG. 4B, an ion implantation process can be performed on the entire surface of the substrate including the remaining conductive layer 165 having the predetermined thickness. The ion implantation process can be performed using ions such as arsenide (As) ions, phosphorous (P) ions, boron (B) ions or the like. In particular, the ions can be selectively implanted onto the conductive layer 165 exposed by the photoresist pattern 150 to form a doped conductive layer 165a.

The conductive layer 165b covered with the photoresist pattern 150 will become a gate electrode.

Figure 4C:
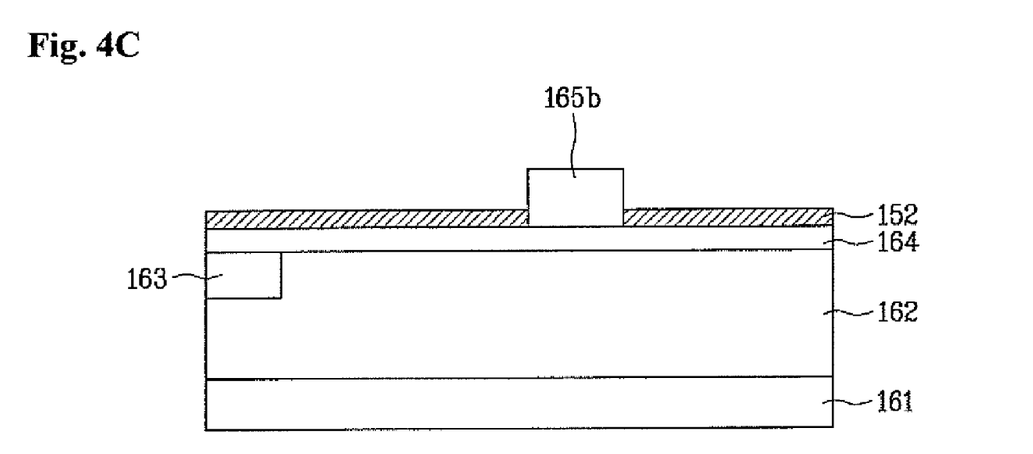

Referring to FIG. 4C, after the photoresist pattern 150 is removed, an oxidation process can be performed on the substrate 161 having the doped conductive layer 165a so that the doped conductive layer 165a is oxidized to form a silicon oxide layer 152.

In the oxidation process, the oxidation rate of the doped conductive layer 165a is greater than that of the conductive layer 165b which will be used as the gate electrode. Therefore, only the doped conductive layer 165a will be selectively oxidized to form the silicon oxide layer 152 using the oxidation rate difference between the layers. Accordingly, the doped conductive layer 165a can be transformed into an oxide layer.

Figure 4D:
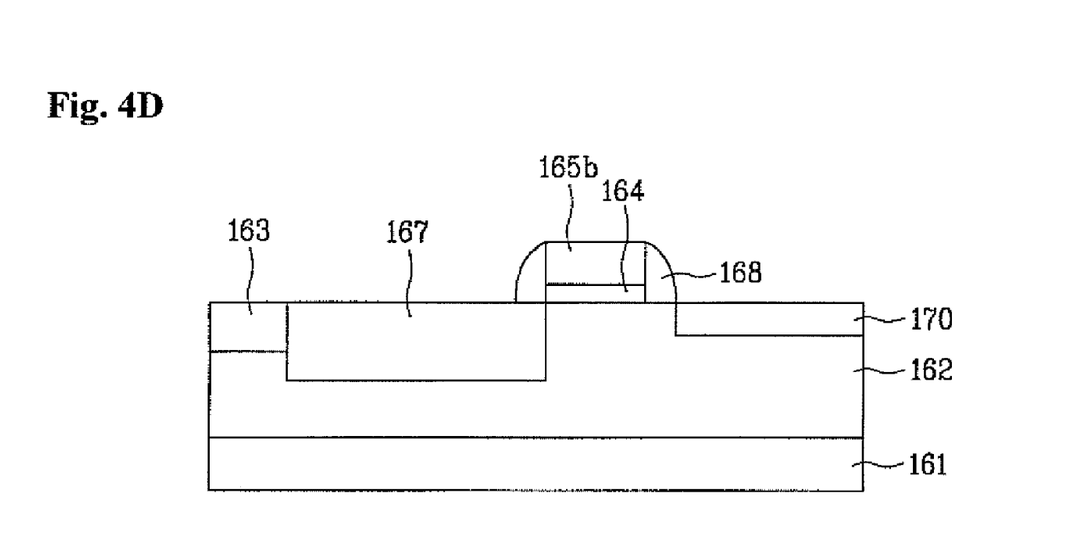

Referring to FIG. 4D, the silicon oxide layer 152 and the insulating layer 164 formed thereunder can be removed through a wet etching process to form a gate electrode 165b and a gate insulating layer 164.

That is, the conductive layer remaining after removing the silicon oxide layer 152 defines the gate electrode 165b, and the insulating layer patterned in the wet etching process defines the gate insulating layer 164.

Then, a second photoresist layer can be coated on the entire surface of the substrate where the gate electrode 165b and the gate insulating layer 164 are formed, and can be selectively patterned so as to expose the respective photodiode regions through exposure and development processes. Thereafter, second conductive type (n-type) impurity ions can be implanted at low concentration onto the epitaxial layer 162 using the patterned second photoresist layer as a mask to form an n-type diffusion region 167 in the photodiode region.

After removing the patterned second photoresist layer, an insulating layer can be formed on the entire surface of the semiconductor substrate 161 including the n-type diffusion region 167. Then, an etch-back process can be performed to form spacers 168 on side surfaces of the gate electrode 165b and the gate insulating layer 164.

Afterward, a third photoresist layer can be coated on the entire surface of the semiconductor substrate 161 including the spacers 168, and can then be patterned so as to cover the respective photodiode regions but expose source/drain regions of each transistor through exposure and development processes (here, a floating diffusion region is shown in the figures). After that, second conductive type (n-type) impurity ions can be implanted at high concentration onto the exposed source/drain regions using the patterned third photoresist layer as a mask to form an n-type diffusion region (floating diffusion region) 170.

Figure 4E:
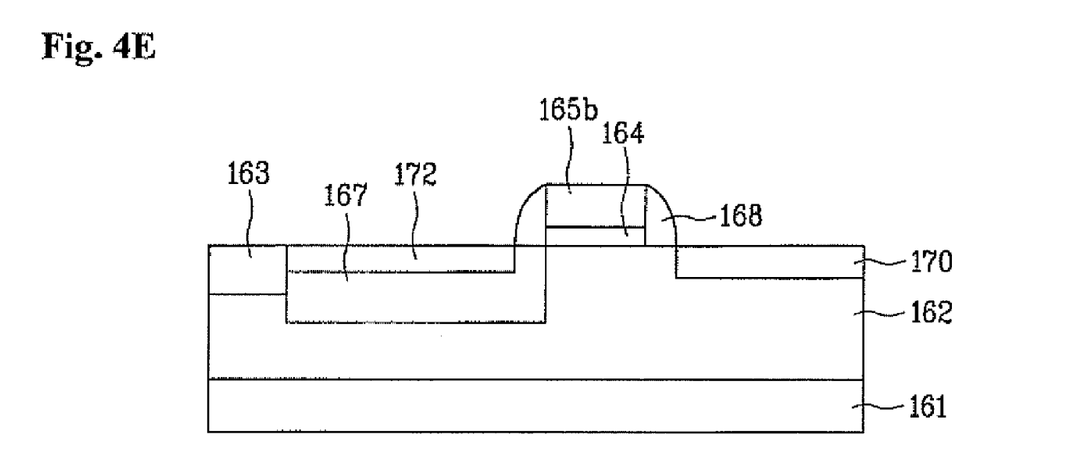

Referring to FIG. 4E, after removing the patterned third photoresist layer, a fourth photoresist layer can be coated on the entire surface of the semiconductor substrate 161, and patterned so as to expose the respective photodiodes. Thereafter, first conductive type (p-type) impurity ions can be implanted onto the epitaxial layer 162 where the n-type diffusion region 167 is formed, thereby forming a p-type diffusion region 172 beneath the surface of the epitaxial layer 162.

The patterned fourth photoresist layer can be removed, and a thermal treatment can be performed on the semiconductor substrate 161 to diffuse the impurity diffusion regions.

A second embodiment of a method for fabricating a CMOS transistor is illustrated in FIGS. 5A to 5G, which are sectional views taken along the line I-I' of FIG. 2.

Figure 5A:
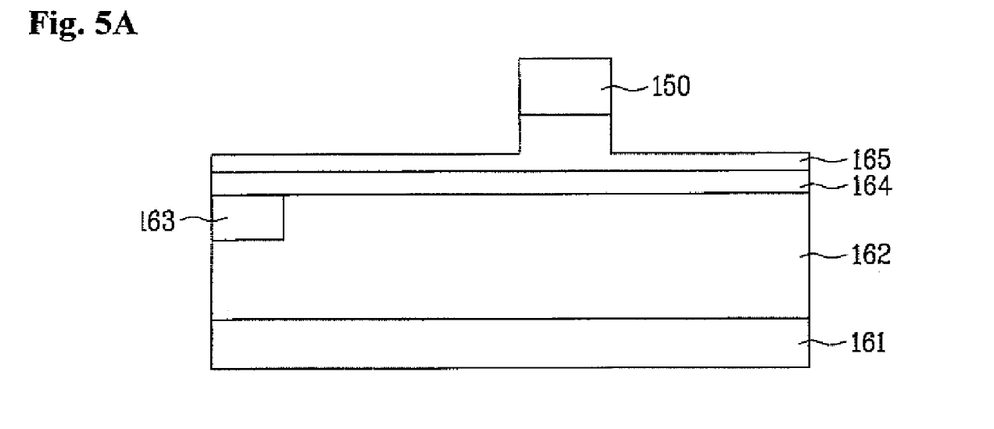
FIGS. 5A to 5G are sectional views illustrating a method for fabricating a CMOS image sensor according to a second embodiment of the present invention.

Referring to FIG. 5A, an epitaxial process can be performed to form a lightly doped p-type epitaxial layer 162 on a heavily doped p-type semiconductor substrate 161.

Subsequently, an active region and a device isolation region can be defined in the semiconductor substrate 161, and a device isolation layer 163 can then be formed on the device isolation region using an STI process.

Then, an insulating layer 164 for a gate insulating layer and a conductive layer 165, e.g., a silicon layer, can be sequentially deposited on the entire surface of the epitaxial layer 162.

Subsequently, a photoresist layer can be coated on the conductive layer 165. After aligning a photo mask having a predetermined pattern over the photoresist layer, a light beam can be irradiated onto the photoresist layer using the photo mask. Thus, the photoresist layer can be exposed and then developed to form a photoresist pattern 150 which will be used for defining a gate electrode.

The conductive layer 165 can be etched to a predetermined thickness using the photoresist pattern 150 as a mask.

Accordingly, the conductive layer remains intact under the photoresist pattern 150 and the conductive layer not covered with the photoresist pattern 150 is left remaining on the entire surface of the substrate with the predetermined thickness so that it is possible to prevent the semiconductor substrate from being damaged in an etching process.

Figure 5B:
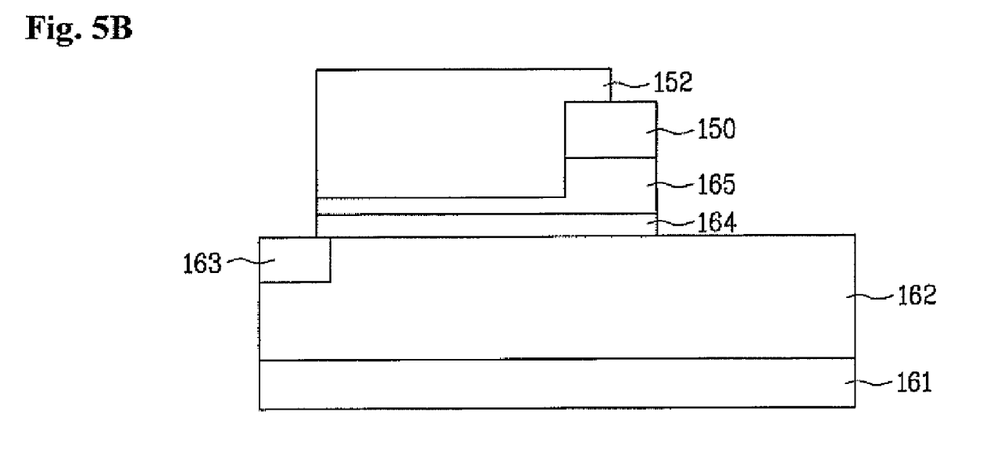

Referring to FIG. 5B, a second photoresist pattern 152 can be formed on the conductive layer 165 with the predetermined thickness such that the second photoresist pattern 152 covers the photodiode region.

The second photoresist pattern 152 can be formed by coating a second photoresist layer on the substrate and hardening it through a development process using UV rays.

The exposed conductive layer 165 can be etched using the second photoresist pattern 152 as an etch mask to remove the conductive layer disposed on the substrate except for the photodiode region. In one embodiment, the photoresist pattern 150 can protect the part of the conductive layer 165 for the gate electrode.

Figure 5C:
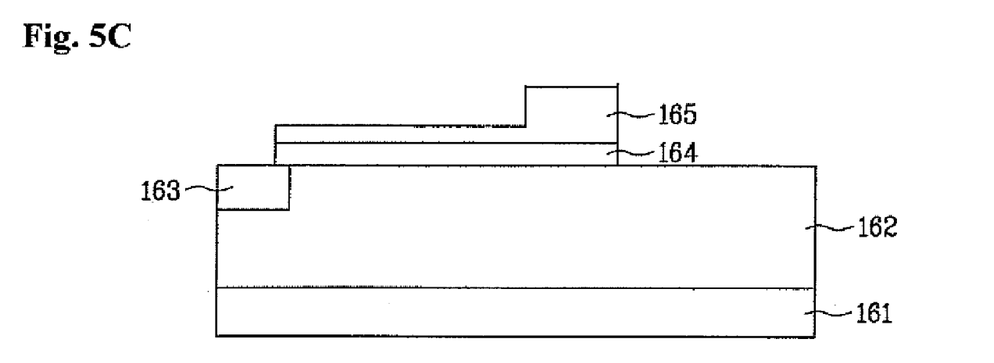

Referring to FIG. 5C, the second photoresist pattern 152 can be removed, and the conductive layer with the predetermined thickness can remain only over the photodiode region.

Figure 5D:
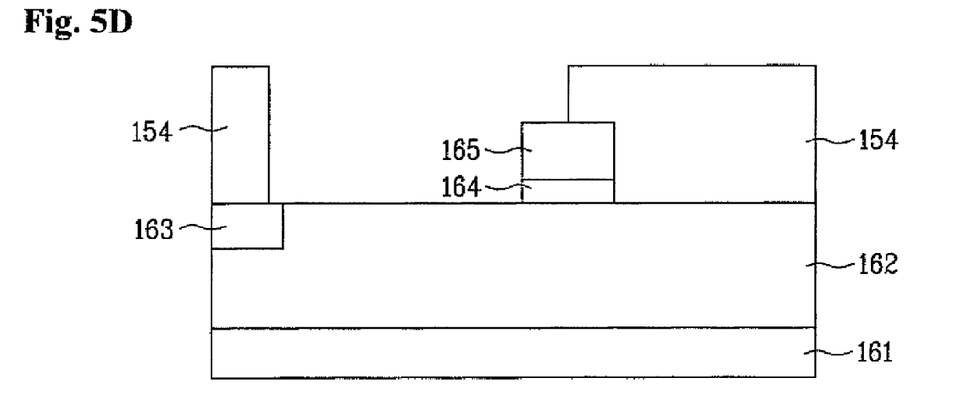

Referring to FIG. 5D, a third photoresist pattern 154 can be formed for removing only the conductive layer 165 formed over the photodiode region.

The conductive layer 165 and the oxide layer 164, which are formed over the photodiode region, can be removed through a wet etching process using the third photoresist pattern 154 as a mask. In contrast to the related art where there occurs ion damage on the surface of the photodiode region due to dry a etching process, there is no damage in the present invention because the ion damage can be prevented by performing the wet etching process.

Figure 5E:
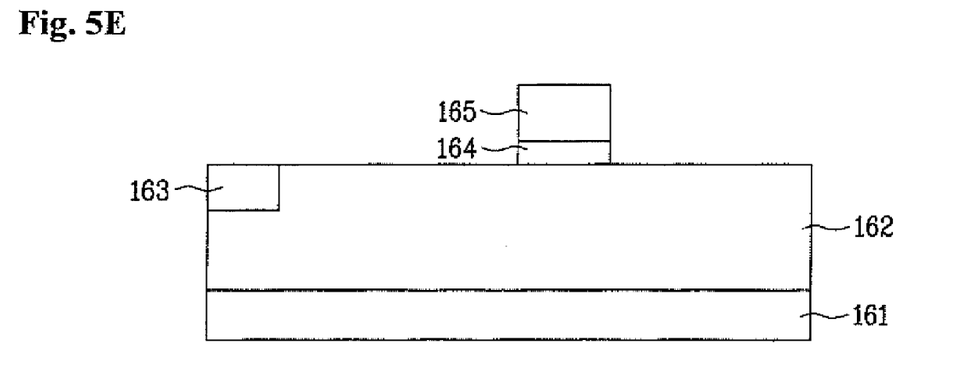

Referring to FIG. 5E, the third photoresist pattern 154 can be removed leaving the gate electrode 165b and the gate insulating layer 164 on the substrate.

Figure 5F:
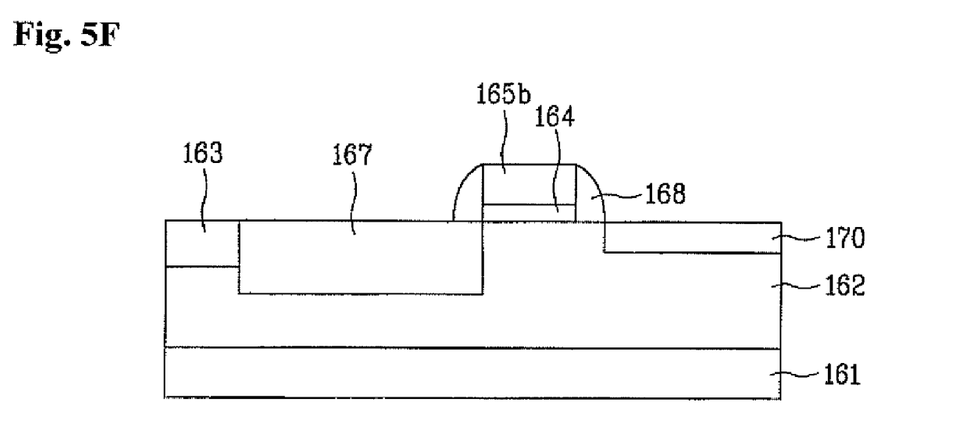

Subsequently, referring to FIG. 5F, a fourth photoresist layer can be coated on the entire surface of the substrate where the gate electrode 165b and the gate insulating layer 164 are formed, and can be selectively patterned so as to expose the respective photodiode regions through exposure and development processes. Thereafter, second conductive type (n-type) impurity ions can be implanted at low concentration onto the epitaxial layer 162 using the fourth patterned photoresist layer as a mask to form an n-type diffusion region 167 in the photodiode region.

Subsequently, after removing the fourth patterned photoresist layer and forming an insulating layer on the entire surface of the semiconductor substrate 161 including the n-type diffusion region 167, an etch-back process can be performed to form spacers 168 on side surfaces of the gate electrode 165b and the gate insulating layer 164.

Afterward, a fifth photoresist layer can be coated on the entire surface of the semiconductor substrate 161 including the spacers 168, and can then be patterned so as to cover the respective photodiode regions but expose source/drain regions of each transistor through exposure and development processes (here, a floating diffusion region is shown in the figures). After that, second conductive type (n-type) impurity ions can be implanted at high concentration onto the exposed source/drain regions using the patterned photoresist layer as a mask to form an n-type diffusion region (floating diffusion region) 170.

Figure 5G:
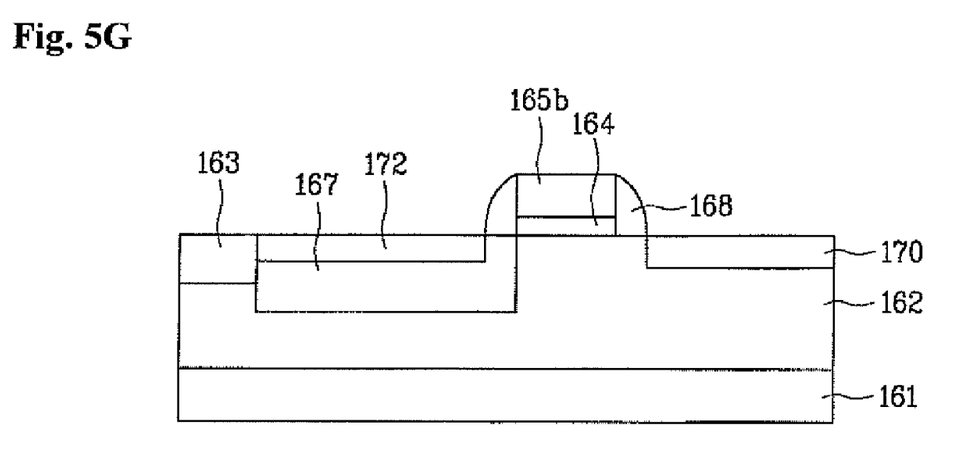

Referring to FIG. 5G, after removing the fifth patterned photoresist layer, a sixth photoresist layer can be coated on the entire surface of the semiconductor substrate 161, and patterned so as to expose the respective photodiodes. Thereafter, first conductive type (p-type) impurity ions can be implanted onto the epitaxial layer 162 where the n-type diffusion region 167 is formed to form a p-type diffusion region 172 beneath the surface of the epitaxial layer 162. The sixth patterned photoresist layer can be removed, and a thermal treatment can be performed on the semiconductor substrate 161 to diffuse the impurity diffusion regions.

Thereafter in embodiments of the subject methods, although not shown in the figures, a plurality of interlayer insulating layers and metal interconnections can be formed on the resultant structure. Then, a color filter layer and a microlens can be formed to complete the CMOS image sensor.

As described above, according to embodiments of the present invention, since the oxide layer (transformed from the doped conductive layer) and/or the insulating layer formed over the photodiode region can be removed through a wet etching process, it is possible to prevent ion damage from occurring on the surface of the photodiode region caused by the dry-etching process in the related art.

In addition, according to embodiments of the present invention, damage of the semiconductor substrate can be prevented because the oxide layer can be formed over the photodiode region and then removed through wet etching process.

Therefore, embodiments of the present invention can prevent the increase of the dark current of the unit pixel for the photodiode, and improve low light performance of the CMOS image sensor It will be apparent to those skilled in the art that various modifications and variations can be made in the present invention. Thus, it is intended that the present invention covers the modifications and variations of this invention provided they come within the scope of the appended claims and their equivalents.

I claim:

1. A method for fabricating a complementary metal oxide semiconductor image sensor, the method comprising:

preparing a semiconductor substrate defining a photodiode region and a transistor region;

sequentially forming an insulating layer and a conductive layer on an entire surface of the semiconductor substrate;

forming a photoresist pattern for defining a gate electrode on the conductive layer;

etching a portion of the conductive layer to a predetermined thickness using the photoresist pattern as a mask;

performing an ion implantation process on the etched portion of the conductive layer to form a doped conductive layer;

performing an oxidation process for oxidizing the doped conductive layer to transform the doped conductive layer into an oxide layer; and removing the oxide layer and the insulating layer disposed thereunder to define a gate electrode and a gate insulating layer.

2. The method according to claim 1, further comprising:

forming a first diffusion region in the photodiode region after defining the gate electrode and the gate insulating layer;

forming spacers on sidewalls of the gate electrode and the gate insulating layer;

forming a second diffusion region in the transistor region after forming the spacers; and forming a third diffusion region on the first diffusion region.

3. The method according to claim 1, wherein performing the ion implantation process to form the doped conductive layer comprises using an ion selected from the group consisting of arsenide (As) ion, phosphorous (P) ion, and boron (B) ion.

4. The method according to claim 1, wherein removing the oxide layer and the insulating layer formed thereunder comprises performing a wet etching process.

5. A method for fabricating a complementary metal oxide semiconductor image sensor, the method comprising:

preparing a semiconductor substrate defining a photodiode region and a transistor region;

sequentially forming an insulating layer and a conductive layer on an entire surface of the semiconductor substrate;

forming a first photoresist pattern on the conductive layer;

etching the conductive layer to a predetermined thickness using the first photoresist pattern as a mask;

forming a second photoresist pattern on the etched conductive layer so as to cover the photodiode region;

etching the conductive layer and the insulating layer using the second photoresist pattern as a mask, wherein a portion of the conductive layer and the insulating layer remain over the photodiode region;

removing the first and second photoresist patterns;

forming a third photoresist pattern exposing only the photodiode region; and removing the portion of the conductive layer and the insulating layer formed over the photodiode region using the third photoresist pattern as a mask to define a gate electrode and a gate insulating layer in the transistor region.

6. The method according to claim 5, further comprising:

forming a first diffusion region in the photodiode region after defining the gate electrode and the gate insulating layer;

forming spacers on sidewalls of the gate electrode and the gate insulating layer;

forming a second diffusion region in the transistor region after forming the spacers; and forming a third diffusion region in the first diffusion region.

7. The method according to claim 5, wherein removing the portion of the conductive layer and the insulating layer formed over the photodiode region comprises performing a wet etching process.

* * * * *